United States Patent
Liu

(10) Patent No.: US 12,218,257 B2
(45) Date of Patent: Feb. 4, 2025

(54) COMPACT CAPACITOR STRUCTURE

(71) Applicant: Realtek Semiconductor Corporation, Hsinchu (TW)

(72) Inventor: Jian Liu, Jiangsu Province (CN)

(73) Assignee: Realtek Semiconductor Corporation, Hsinchu (TW)

( * ) Notice: Subject to any disclaimer, the term of this patent is extended or adjusted under 35 U.S.C. 154(b) by 38 days.

(21) Appl. No.: 17/452,394

(22) Filed: Oct. 26, 2021

(65) Prior Publication Data

US 2022/0416094 A1 Dec. 29, 2022

(30) Foreign Application Priority Data

Jun. 25, 2021 (CN) .......................... 202110709522.9

(51) Int. Cl.
*H01L 29/94* (2006.01)
*H01L 23/522* (2006.01)
*H01L 49/02* (2006.01)

(52) U.S. Cl.
CPC .......... *H01L 29/94* (2013.01); *H01L 23/5223* (2013.01); *H01L 28/40* (2013.01)

(58) Field of Classification Search
CPC .......... H01L 23/5223; H01L 28/40–92; H01L 29/66174; H01L 29/93; H01L 29/66181; H01L 29/66189; H01L 29/94; H01L 27/0805; H01L 27/0808
See application file for complete search history.

(56) References Cited

U.S. PATENT DOCUMENTS

| | | | | |
|---|---|---|---|---|
| 2007/0075397 A1* | 4/2007 | Zhang | ..................... | H01L 28/40 |
| | | | | 257/E29.345 |
| 2007/0181918 A1* | 8/2007 | Wada | ..................... | H01L 29/94 |
| | | | | 257/288 |
| 2012/0043595 A1* | 2/2012 | Chang | ..................... | H01L 28/86 |
| | | | | 257/E29.345 |
| 2012/0068238 A1* | 3/2012 | Ginsburg | ............ | H01L 23/5227 |
| | | | | 257/E29.345 |
| 2013/0119449 A1* | 5/2013 | Chen | ..................... | H01L 28/60 |
| | | | | 257/532 |

(Continued)

OTHER PUBLICATIONS

Merriam-Webster Dictionary definition of "encircle" (Year: 2024).*

*Primary Examiner* — Yu Chen
(74) *Attorney, Agent, or Firm* — CKC & Partners Co., LLC

(57) ABSTRACT

A capacitor structure, including a transistor structure, a first metal conductive structure and a second metal conductive structure, is provided. The transistor structure includes a first ladder-shaped frame of a polycrystalline silicon layer and multiple first metal strips of a first metal layer. The first ladder-shaped frame is electrically isolated from the multiple first metal strips, and encircles a part of the multiple first metal strips. The first ladder-shaped frame forms a gate of the transistor structure. The multiple first metal strips form a drain and a source of the transistor structure. The first metal conductive structure is substantially overlapped with the first ladder-shaped frame. The second metal conductive structure is electrically connected to the multiple first metal strips, in which the second metal conductive structure is disposed across and electrically isolated from the first ladder-shaped frame and the first metal conductive structure.

4 Claims, 10 Drawing Sheets

(56) References Cited

U.S. PATENT DOCUMENTS

| | | | | |
|---|---|---|---|---|
| 2014/0252543 A1* | 9/2014 | Li | ............................ | H01L 28/88 |
| | | | | 257/532 |
| 2015/0084107 A1* | 3/2015 | Li | ............................ | H01L 29/93 |
| | | | | 257/300 |
| 2018/0145071 A1 | 5/2018 | Zhao et al. | | |
| 2019/0189608 A1* | 6/2019 | Cheng | ................. | H01L 23/5223 |
| 2019/0378793 A1* | 12/2019 | Cheng | ................. | H01L 27/0629 |
| 2021/0028165 A1 | 1/2021 | Yu et al. | | |

\* cited by examiner

COMPACT CAPACITOR STRUCTURE

CROSS-REFERENCE TO RELATED APPLICATION

This application claims priority to China Application Serial Number 202110709522.9, filed Jun. 25, 2021, which is herein incorporated by reference in its entirety.

BACKGROUND

Technical Field

The present disclosure relates to a capacitor structure, especially a compact capacitor structure including a metal oxide semiconductor capacitor and a metal oxide metal capacitor.

Description of Related Art

Metal oxide semiconductor (MOS) capacitors and metal oxide metal (MOM) capacitors are often used as voltage regulator capacitors. In order to improve the efficiency of the layout area and increase the capacitance value, sometimes MOM capacitors are arranged above MOS capacitors, and the MOM capacitors and the MOS capacitors are coupled in parallel. The traditional layout method avoids the MOM capacitors from using the metal layer used by the MOS capacitors to avoid short circuit between the MOM capacitors and the MOS capacitors. However, such method wastes the layout area of the metal layer and reduces design flexibility. In addition, there can be a large parasitic resistance at the gate of the MOS capacitor causing bad high-frequency characteristics.

SUMMARY

One aspect of the present disclosure is to provide a capacitor structure, comprising a transistor structure, a first metal conductive structure and a second metal conductive structure. The transistor structure comprises a first ladder-shaped frame of a polycrystalline silicon layer and a plurality of first metal strips of a first metal layer. The first ladder-shaped frame is electrically isolated from the plurality of first metal strips, and encircles a part of the plurality of first metal strips, the first ladder-shaped frame is configured to form a gate of the transistor structure, and the plurality of first metal strips are configured to form a drain and a source of the transistor structure. The first metal conductive structure is substantially overlapped and electrically connected to the first ladder-shaped frame. The second metal conductive structure is electrically connected to the plurality of first metal strips, in which the second metal conductive structure is disposed across and electrically isolated from the first ladder-shaped frame and the first metal conductive structure.

Another aspect of the present disclosure is to provide a capacitor structure, comprising a polycrystalline silicon layer, a first metal layer, a second metal layer and a third metal layer. The polycrystalline silicon layer is configured to form a first ladder-shaped frame. The first ladder-shaped frame is configured to form a gate of a transistor structure. The first metal layer is configured to form a plurality of first metal strips. The plurality of first metal strips is configure to form a drain and a source of the transistor structure. The first ladder-shaped frame is electrically isolated from the plurality of first metal strips, and encircles a part of the plurality of first metal strips. The first metal layer, the second metal layer and the third metal layer are configured to form a first metal conductive structure and a second metal conductive structure. The first metal conductive structure is substantially overlapped and electrically connected to the first ladder-shaped frame. The second metal conductive structure is electrically connected to the plurality of first metal strips, in which the second metal conductive structure is disposed across and electrically isolated from the first ladder-shaped frame and the first metal conductive structure.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
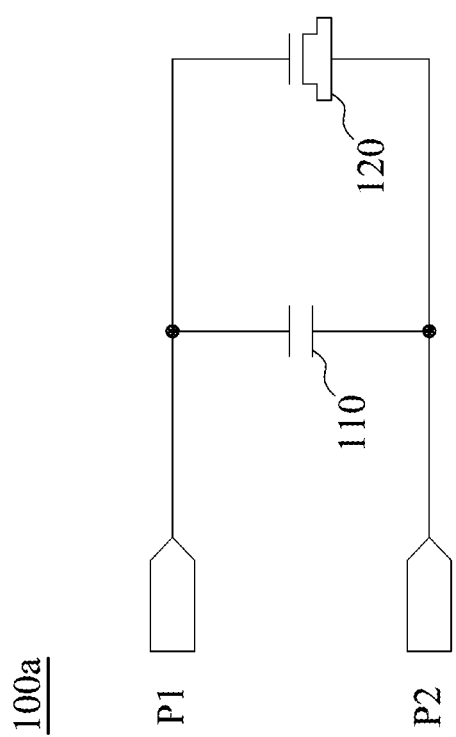
FIG. 1 is a simplified function block diagram of a capacitor structure in one embodiment of the present disclosure.

The following will illustrate the embodiments of the present disclosure with related figures. In the figures, the same reference numerals indicate the same or similar elements or method flows.

FIG. 1 is a simplified function block diagram of a capacitor structure 100a in one embodiment of the present disclosure. The capacitor structure 100a includes a Metal Oxide Metal capacitor (MOM capacitor) 110, a Metal Oxide Semiconductor capacitor (MOS capacitor) 120, a power terminal P1 and a power terminal P2. The MOM capacitor 110 and the MOS capacitor 120 are connected in parallel between a power terminal P1 and a power terminal P2. In the MOS capacitor 120, the source and the drain of the Metal oxide semiconductor transistor are coupled to each other to form a capacitor. The MOM capacitor 110 is formed by multiple stacked metal layers, and the MOM capacitor 110 and the MOS capacitor 120 can be overlapped with each other (e.g., areas of these capacitors are at least partially overlapped from the top view of the layout), so that the capacitor structure 100a can provide a better capacitance value in a limited space.

Figure 2:
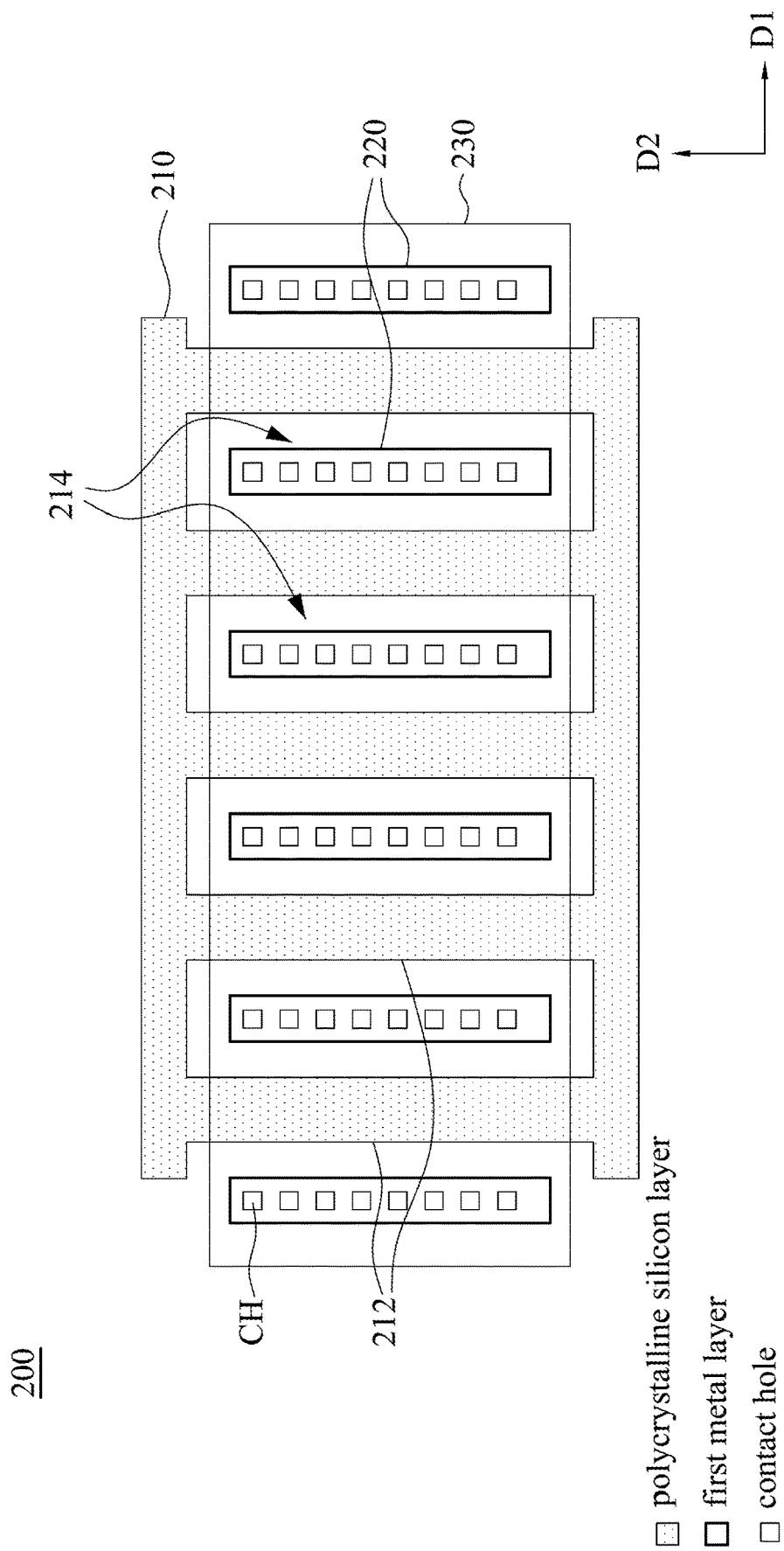
FIG. 2 is a schematic diagram of the transistor structure in one embodiment of the present disclosure.

The capacitor structure 100a will be described below with reference to FIG. 2-FIG. 5. FIG. 2 is a schematic diagram of the transistor structure 200 in one embodiment of the present disclosure. The transistor structure 200 is configured to form a part of the MOS capacitor 120. The transistor structure 200 includes a first ladder-shaped frame 210 and multiple first metal strips 220. The first ladder-shaped frame 210 is implemented by a polycrystalline silicon layer, and is configured to form the gate of the transistor structure 200. The multiple first metal strips 220 are implemented by the first metal layer, and are configured to form the source and the drain of the transistor structure 200. The first ladder-shaped frame 210 and the multiple first metal strips 220 are electrically isolated from each other. In some embodiments, the transistor structure 200 further includes a substrate 230. The first metal strips 220 is electrically connected to the substrate 230 by the multiple contact holes CH.

As shown in FIG. 2, the whole first ladder-shaped frame 210 extends along a first direction D1 and includes multiple connection portions 212. The multiple connection portions 212 extend along a second direction D2, and are spaced apart from each other, thereby forming multiple opening portions 214. The first direction D1 and the second direction D2 can be visualized as cross-lines with arrows (e.g., the arrow lines cross and substantially perpendicular as shown in the Figure). Each of the opening portions 214 encircles one of the multiple first metal strips 220. That is, the first ladder-shaped frame 210 surrounds a part of the multiple first metal strips 220.

Figure 3:
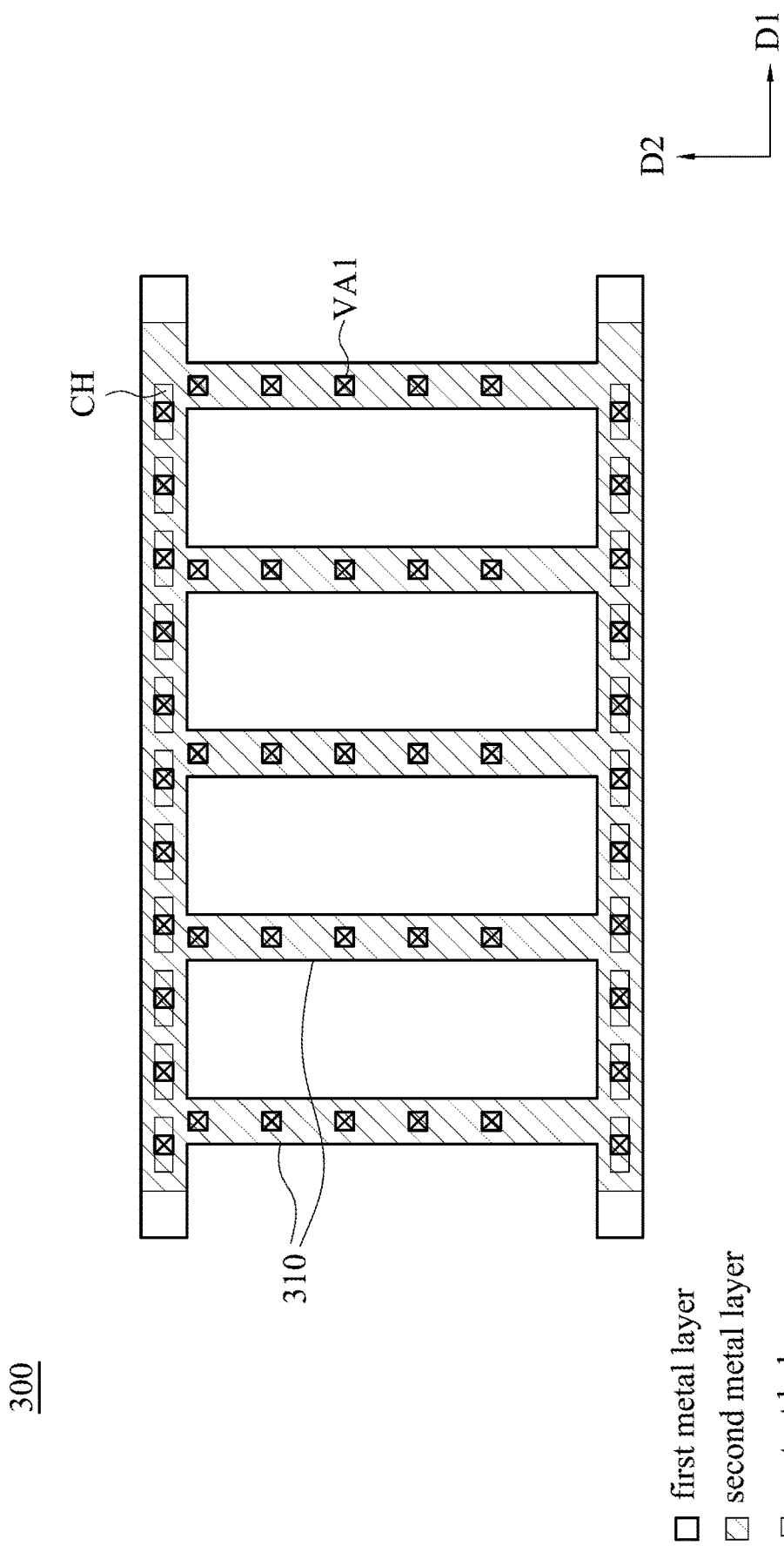
FIG. 3 is a schematic diagram of the second ladder-shaped frame in one embodiment of the first metal conductive structure.

FIG. 3 is a schematic diagram of the second ladder-shaped frame 300 in one embodiment of the first metal conductive structure. In the present disclosure, the first metal conductive structure refers to a circuit used to electrically connect to the power terminal P1 and the gate of the transistor structure 200 in the capacitor structure 100a of FIG. 1. As shown in FIG. 1, the first metal conductive structure is configured to form one side conductor of the MOM capacitor 110 or form the MOS capacitor 120. The second ladder-shaped frame 300 is implemented by the first metal layer and the second metal layer. The first metal layer of the second ladder-shaped frame 300 is electrically connected to the first ladder-shaped frame 210 by the contact hole CH, and the second metal layer of the second ladder-shaped frame 300 is electrically connected to the first metal layer of the second ladder-shaped frame 300 through a first via VA1.

As shown in FIG. 3, the first metal layer and the second metal layer of the second ladder-shaped frame 300 is in a ladder-shape form, and the whole second ladder-shaped frame 300 extends along the first direction D1. The second ladder-shaped frame 300 includes multiple connection portions 310 (also includes the parts arranged in the first metal layer and the second metal layer). The multiple connection portions 310 extend along the second direction D2, and are spaced apart from each other. The multiple connection portions 310 are respectively disposed above the multiple connection portions 212 of the first ladder-shaped frame 210. It is noted that the connection portion 310 of the second ladder-shaped frame 300 and the connection portion 212 of the first ladder-shaped frame 210 are not connected by the contact hole CH.

The second ladder-shaped frame 300 is substantially overlapped with the first ladder-shaped frame 210. That is, in some embodiments, if project the first ladder-shaped frame 210 and the second ladder-shaped frame 300 vertically onto a plane parallel to the two frames 210, 300 (it is understood that, from the top view (a view observed from the direction that penetrates into the figure plane from the outside of the figure), the projection area of the two frames being projected on the plane, which is defined by a x-axis corresponding to the first direction D1 and a y-axis corresponding to the second direction D2), the projected area of the second ladder-shaped frame 300 completely or substantially fall within the projected area of the first ladder-shaped frame 210. In other words, when the present disclosure describes that two different elements are substantially overlapped, it means that the vertical projection area of one of the two elements will completely or substantially fall within the vertical projection area of the other.

In one embodiment, the number of the connection portion 310 of the second ladder-shaped frame 300 is equal to the number of the connection portion 212 of the first ladder-shaped frame 210, but the present disclosure is not limited to this. In some embodiments, the connection portion 212 of the first ladder-shaped frame 210 has a width several times that of the connection portion 310 of the second ladder-shaped frame 300 in the first direction D1. Therefore, the number of the connection portions 310 of the second ladder-shaped frame 300 can exceed the number of the connection portions 212 of the first ladder-shaped frame 210. That is, the multiple connection portions 310 of the second ladder-shaped frame 300 can be arrange above one of the connection portions 212 of the first ladder-shaped frame 210.

Figure 4:
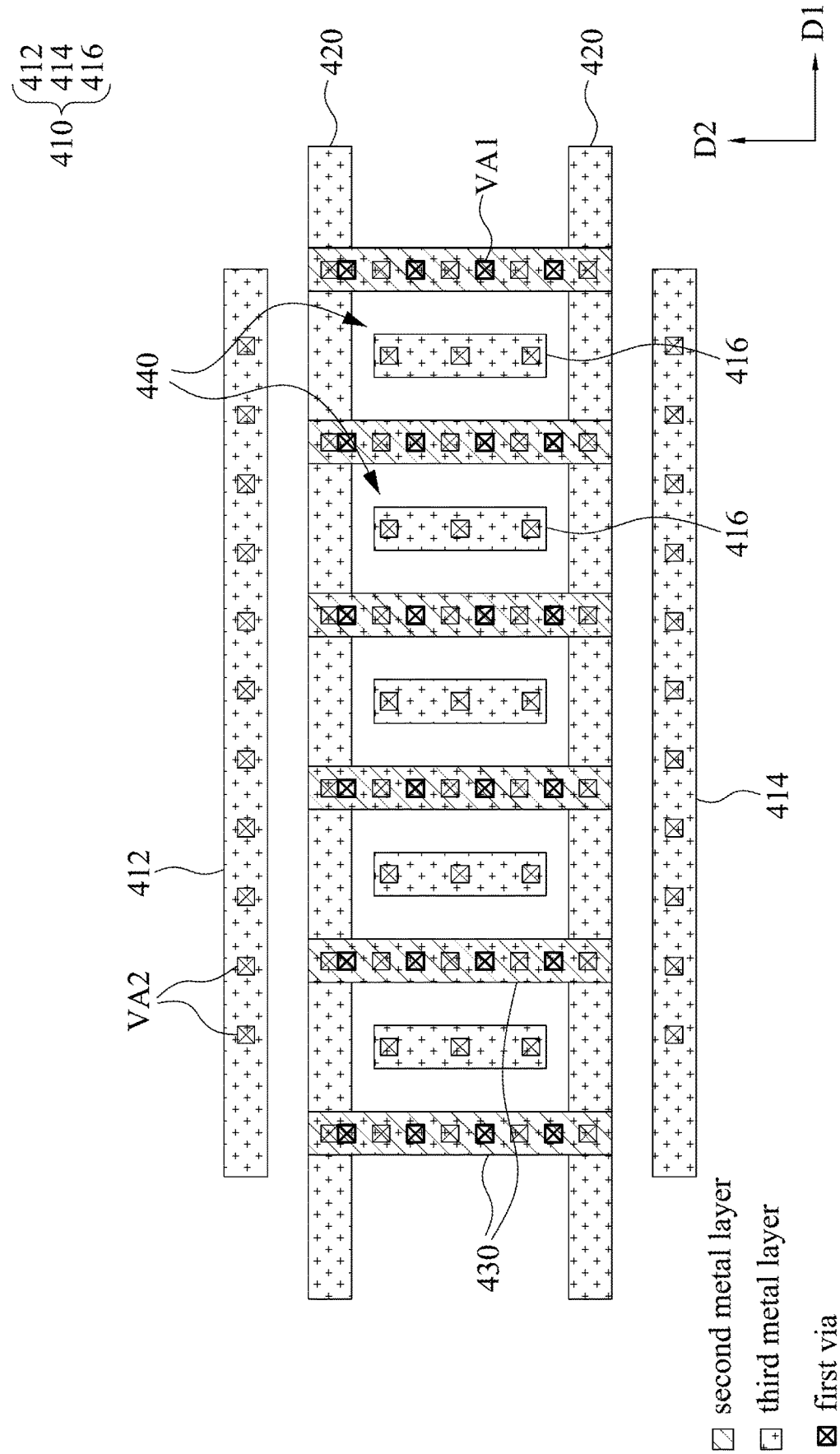
FIG. 4 is a schematic diagram of the conductive pattern in one embodiment of the first metal conductive structure, and a schematic diagram of the second metal conductive structure in one embodiment of the present disclosure.

FIG. 4 is a schematic diagram of the conductive pattern 410 in one embodiment of the first metal conductive structure, and a schematic diagram of the second metal conductive structure in one embodiment of the present disclosure. In the present disclosure, the second metal conductive structure refers to the circuit configured to electrically connected to the power terminal P2 and the source and the drain of the transistor structure 200. As shown in FIG. 1, the second metal conductive structure is configured to form the other side conductor of the MOM capacitor 110, or is configured to form the MOS capacitor 120.

The conductive pattern 410 is implemented by the third metal layer, and is substantially overlapped with the second ladder-shaped frame 300. The conductive pattern 410 is electrically connected to the second metal layer of the second ladder-shaped frame 300 through multiple second vias VA2. The conductive pattern 410 includes a first extension portion 412, a second extension portion 414 and multiple second metal strips 416. The first extension portion 412 and the second extension portion 414 are parallel to each other and extend along the first direction D1. The multiple second metal strips 416 are arranged between the first extension portion 412 and the second extension portion 414 in the first direction D1, and extend along the second direction D2.

The multiple second metal strips 416 are respectively disposed on top of the multiple connection portions 310 of the second ladder-shaped frame 300. Therefore, in one embodiment, the number of the second metal strips 416 is equal to as the number of the connection portions 310 of the second ladder-shaped frame 300, and is also equal to the number of the connection portions 212 of the first ladder-shaped frame 210, but the present disclosure is not limited to this. In some embodiments, when the width of the connection portion 212 of the first ladder-shaped frame 210 is several times the width of the connection portion 310 of the second ladder-shaped frame 300, the number of the second metal strips 416 can increase corresponding to the number of the connection portion 310, and exceed the number of the connection portion 212.

The second metal conductive structure is arranged between the first extension portion 412 and the second extension portion 414, and includes multiple (e.g., two) main portions 420 and multiple third metal strips 430. The multiple main portions 420 are implemented by the third metal layer, are arranged parallel to each other, and extend along the first direction D1. The multiple third metal strips 430 are electrically connected to and substantially overlapped with the multiple first metal strips 220, respectively. The third metal strips 430 are implemented by the second metal layer and the third metal layer. The second metal layer of the third metal strip 430 is electrically connected to the corresponding first metal strip 220 through multiple first via VA1. The third metal layer of the third metal bar 430 is electrically connected to the second metal layer of the third metal bar 430 multiple second via VA2.

As shown in FIG. 4, the multiple third metal strips 430 are arranged between the multiple main portions 420 along the first direction D1, and extend along the second direction D2 to connected to the multiple main portions 420. Therefore, the multiple main portions 420 and the multiple third metal strips 430 are cross-connected, so that the second metal conductive structure is in a ladder-shaped form having the multiple opening portions 440. All the second metal strips 416 of the conductive pattern 410 are encircled by the second metal conductive structure. Specifically, each of the opening portions 440 of the second metal conductive structure encircles a corresponding second metal strip 416, but the present disclosure is not limited to this. In some embodiments, when the width of the connection portion 212 of the first ladder-shaped frame 210 is several times the width of the connection portion 310 of the second ladder-shaped frame 300, each of the opening portions 440 can encircle multiple corresponding second metal strips 416.

Figure 5:
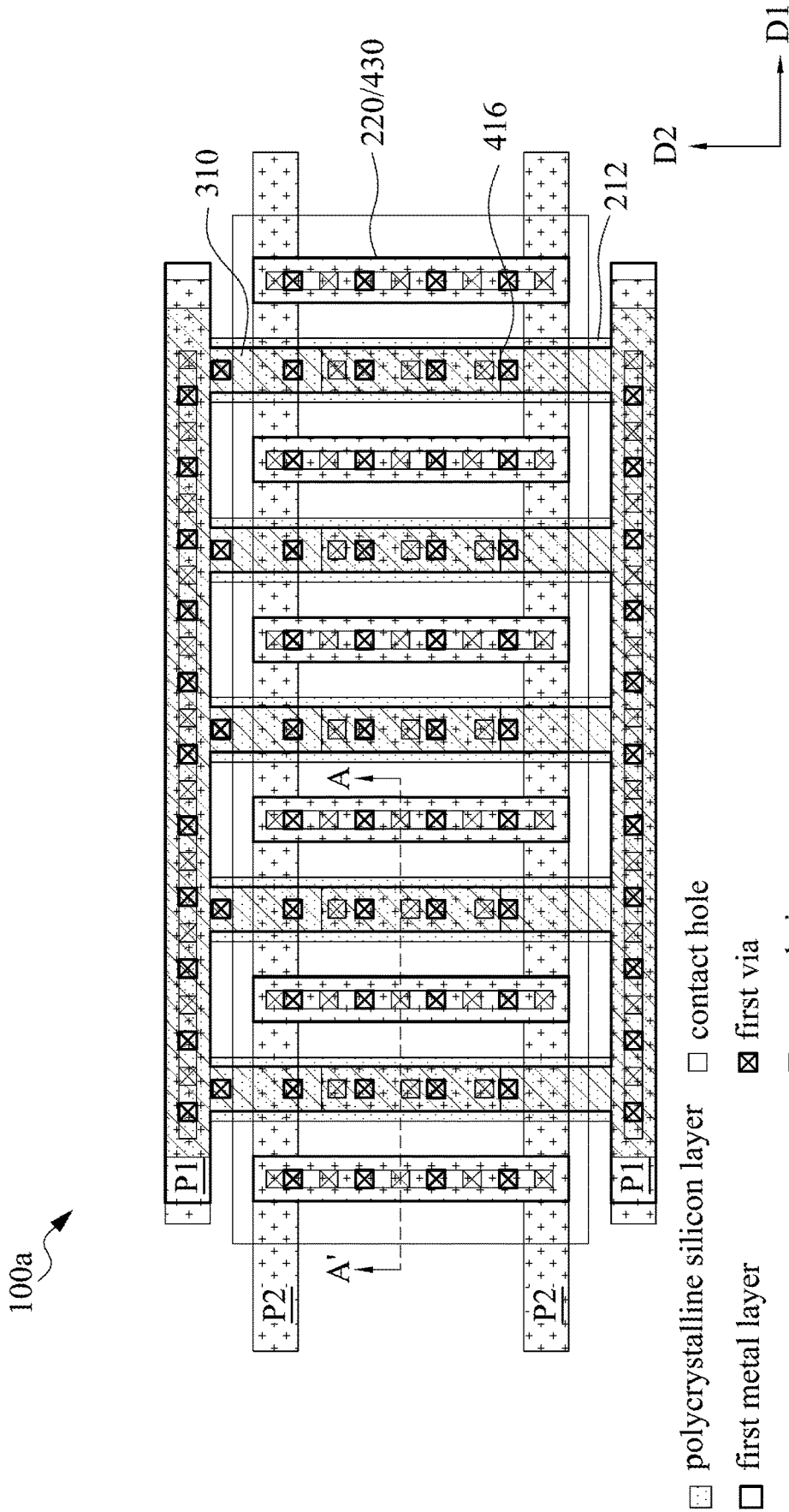
FIG. 5 is a top view of the capacitor structure in one embodiment of the present disclosure.

FIG. 5 is a top view of the capacitor structure 100a in one embodiment of the present disclosure. Specifically, the capacitor structure 100a in FIG. 5 is formed by sequentially stacking the circuit structures in FIG. 2, FIG. 3, and FIG. 4 from bottom to top. The first metal conductive structure is electrically connected to the gate of the transistor structure 200 and the power terminal P1. The second metal conductive structure is electrically connected to the power terminal P2 and the source and the drain of the transistor structure 200. The second metal conductive structure disposes across the first metal conductive structure and the first ladder-shaped frame 210 (i.e., the gate of the transistor structure 200) along the first direction D1. However, the second metal conductive structure is isolated from the first metal conductive structure and the first ladder-shaped frame 210. That is, the second metal conductive structure is isolated from the first ladder-shaped frame 210, and isolated from the second ladder-shaped frame 300 and the conductive pattern 410 of the first metal conductive structure.

As shown in FIG. 5, one of the connection portions 310 in FIG. 3 and one of the second metal strips 416 in FIG. 4 are arranged between two adjacent first metal strips 220 (or two adjacent third metal strips 430), but the present disclosure is not limited to this. In some embodiments, when the width of the connection portion 212 of the first ladder-shaped frame 210 is several times the width of the connection portion 310 of the second ladder-shaped frame 300, multiple connection portions 310 in FIG. 3 and multiple second metal strips 416 in FIG. 4 may be arranged between two adjacent first metal strips 220 (or two adjacent third metal strips 430).

By applying a potential difference to the transistor structure 200 through the first metal conductive structure and the second metal conductive structure, the transistor structure 200 can be used to form the MOS capacitor 120 in FIG. 1. In some embodiments, when the potential difference between the first metal conductive structure and the second metal conductive structure exceeds the threshold voltage of the transistor structure 200, the MOS capacitor 120 may have a larger capacitance value. In addition, the MOM capacitor 110 in FIG. 1 can be formed by stacking the metals in the first metal conductive structure and the second metal conductive structure. The MOM capacitor 110 will be described below with reference to FIG. 6.

Figure 6:
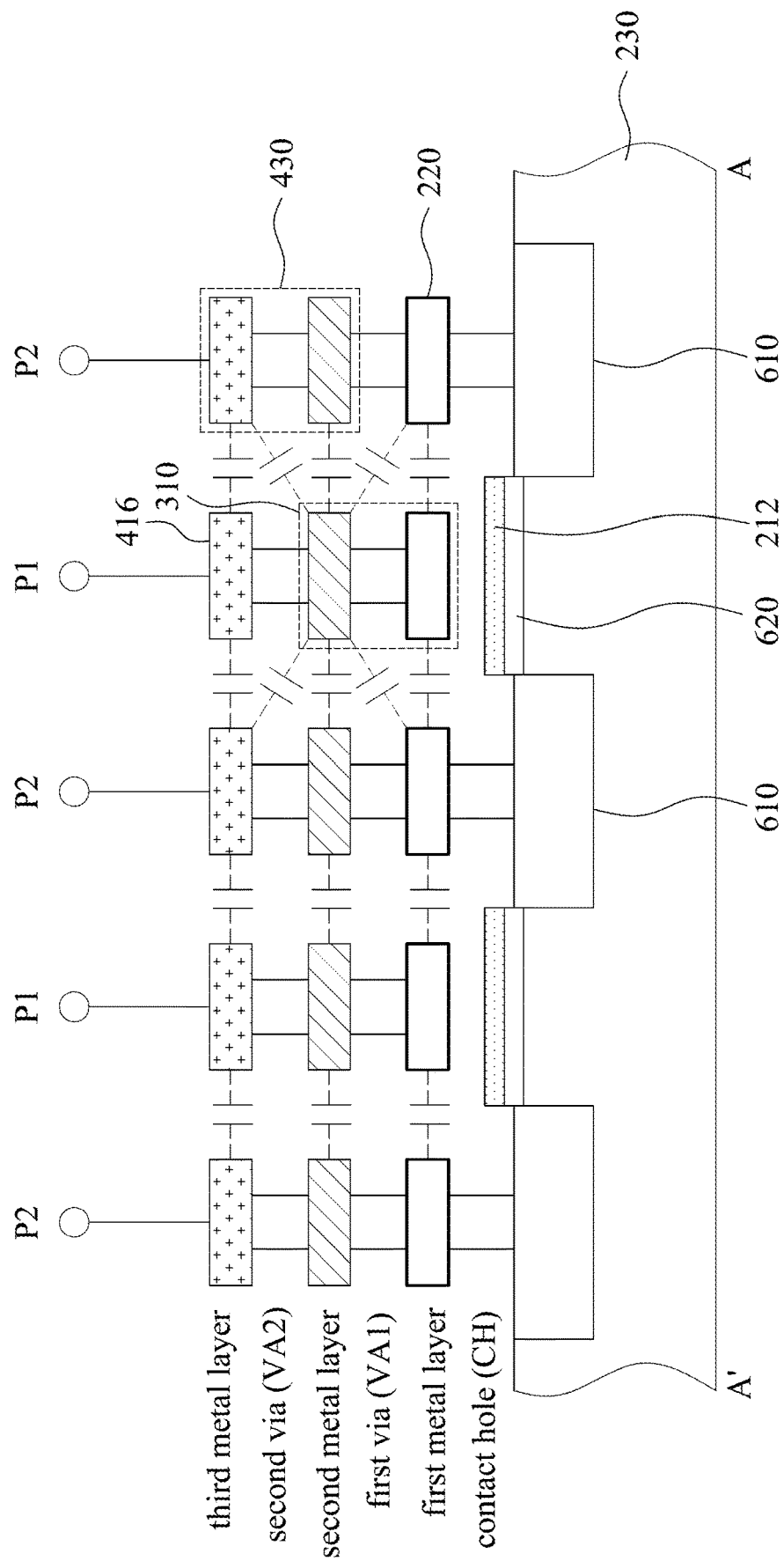
FIG. 6 is a cross-sectional view taken along the section line AA' of FIG. 5.

FIG. 6 is a cross-sectional view taken along the section line AA' of FIG. 5. As shown in FIG. 6, the substrate 230 includes multiple heavily doped regions 610 and an oxide layer 620. The heavily doped regions 610 are electrically connected to the first metal strips 220 via the contact hole CH. The oxide layer 620 is arranged under the connection portion 212 of the first ladder-shaped frame 210. The heavily doped regions 610 are configured to form the source region and the drain region of the transistor structure 200. In some embodiments, the heavily doped regions 610 may have N-type dopants, and is arranged in a P-type well (not shown). That is, the heavily doped regions 610 and the well region where it is located have different types of dopants, but the present disclosure is not limited to this.

In some embodiments, the heavily doped region 610 may have N-type dopants and be arranged in an N-type well. That is, the heavily doped region 610 has the identical type of dopant as the well region (e.g., the substrate 230) where it is located. In this case, a MOS varactor that includes the transistor structure 200 can be formed in the capacitor structure 100a. That is, the MOS capacitor 120 can be selectively replaced with a MOS varactor.

The metal layers in the vertical direction have no parasitic capacitance because they are electrically connected to each other. However, there is a parasitic capacitance between adjacent metal layers in the horizontal direction. These parasitic capacitances form the MOM capacitor 110. For example, the first metal layer in the connection portion 310 of the second ladder-shaped frame 300 can form the parasitic capacitance with the first metal strips 220 that are also the first metal layer. The second metal layer in the connection portion 310 of the second ladder-shaped frame 300 can form the parasitic capacitance with the second metal layer in the third metal strips 430. The second metal strips 416 implemented by the third metal layer can form the parasitic capacitance with the third metal layer in the third metal strips 430. In some embodiments, the MOM capacitor 110 also includes the parasitic capacitance in a non-horizontal direction. For example, the second metal layer in the connection portion 310 of the second ladder-shaped frame 300 can form a multi-directional parasitic capacitance with the first metal layer and the third metal layer adjacent in the non-vertical direction.

As mentioned above, the MOM capacitor 110 of the capacitor structure 100a can be implemented by the metal layer used by the MOS capacitor 120 (e.g., the first metal layer), so as to improve space utilization efficiency and design flexibility. In addition, the capacitor structure 100a stacks multiple layers of metal on the gate of the MOS capacitor 120, which can reduce the parasitic resistance of the gate of the MOS capacitor 120 and improve the high frequency characteristics of the MOS capacitor 120. It is noted that stacking metal layers on the gate of the MOS capacitor 120 does not limit the circuit layout space of the MOM capacitor 110. On the contrary, the metal layer stacked on the gate of the MOS capacitor 120 forms a part of the MOM capacitor 110, and increases the capacitance value of the MOM capacitor 110.

Figure 7:
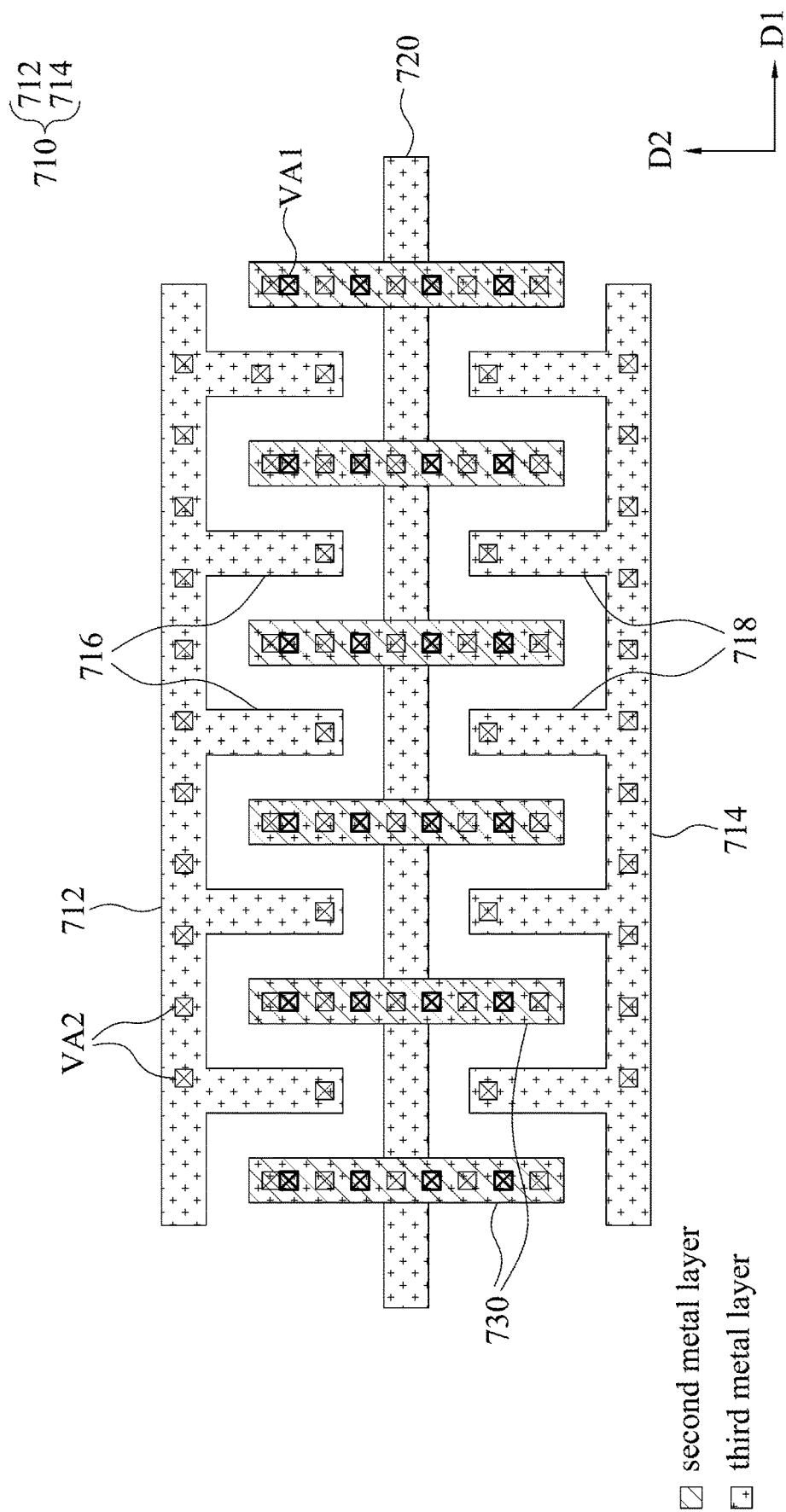
FIG. 7 is a schematic diagram of the conductive pattern in one embodiment of the first metal conductive structure, and a schematic diagram of the second metal conductive structure in one embodiment of the present disclosure.

FIG. 7 is a schematic diagram of the conductive pattern 710 in one embodiment of the first metal conductive structure, and a schematic diagram of the second metal conductive structure in one embodiment of the present disclosure. The conductive pattern 710 is implemented by the third metal layer, and is substantially overlapped with the second ladder-shaped frame 300. The conductive pattern 710 is electrically connected to the second metal layer of the second ladder-shaped frame 300 through the multiple second vias VA2. The conductive pattern 710 include the first finger-shaped structure 712 and the second finger-shaped structure 714. The first finger-shaped structure 712 include multiple first metal jogs 716, and the second finger-shaped structure 714 includes multiple second metal jogs 718. The first metal jogs 716 and the second metal jogs 718 extend toward each other in the second direction D2.

The multiple first metal jogs 716 are substantially overlapped with the multiple connection portions 310 of the second ladder-shaped frame 300, respectively. The multiple second metal jogs 718 are also substantially overlapped with the multiple connection portions 310 of the second ladder-shaped frame 300, respectively. Therefore, in one embodiment, the number of the first metal jogs 716 and the second metal jogs 718 is equal to the number of the connection portion 310 of the second ladder-shaped frame 300, and is also equal to the number of the connection portion 212 of the first ladder-shaped frame 210, but the present disclosure is not limited to this. In some embodiments, when the width of the connection portion 212 of the first ladder-shaped frame 210 is several times the width of the connection portion 310 of the second ladder-shaped frame 300, the respective numbers of the first metal jogs 716 and the second metal jogs 718 can increase corresponding to the number of the connection portions 310, and exceed the number of the connection portions 212.

The second metal conductive structure in FIG. 7 includes main portions 720 and multiple third metal strips 730. The main portions 720 are implemented by the third metal layer. The main portions 720 arranged between the multiple first metal jogs 716 and the multiple second metal jogs 718 and extend along the first direction D1. The multiple third metal strips 730 are implemented by the second metal layer and the third metal layer, and extend along the second direction D2. The multiple third metal strips 730 are electrically connected to and substantially overlapped with the multiple first metal strips 220, respectively. The main portions 720 cross the multiple third metal strips 730, causing the second metal conductive structure in FIG. 7 in a fishbone-shape form.

Figure 8:
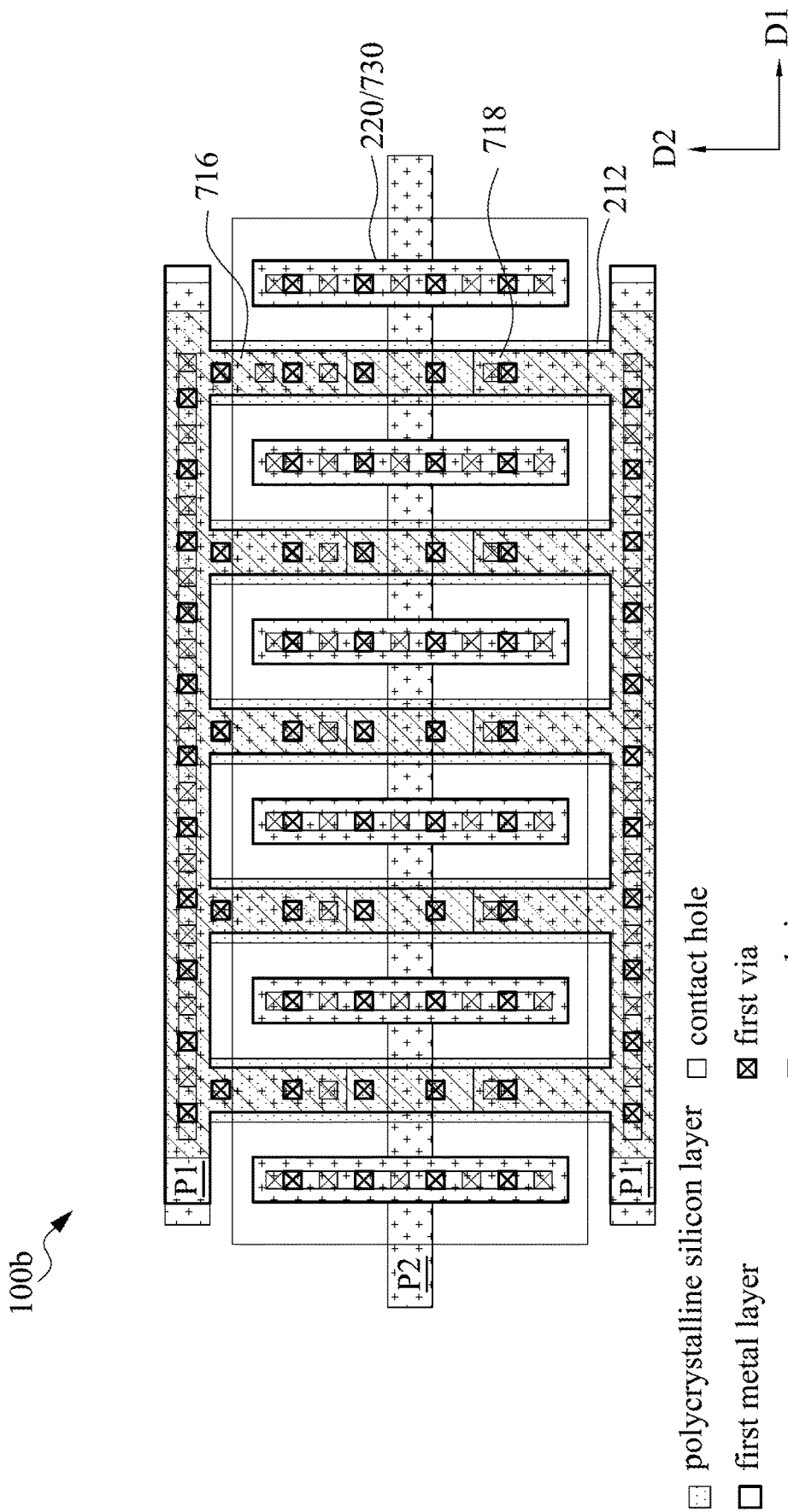
FIG. 8 is a top view of the capacitor structure in one embodiment of the present disclosure.

FIG. 8 is a top view of the capacitor structure 100b in one embodiment of the present disclosure. Specifically, the capacitor structure 100b in FIG. 8 is formed by sequentially stacking the circuit structures in FIG. 2, FIG. 3, and FIG. 7 from bottom to top. As shown in FIG. 8, one of the connection portions 310 in FIG. 3, one of the first metal jogs 716 in FIG. 7 and one of the second metal jogs 718 in FIG. 7 are arranged between two adjacent first metal strips 220 (or two adjacent third metal strips 730), but the present disclosure is not limited to this. In some embodiments, when the width of the connection portion 212 of the first ladder-shaped frame 210 is several times the width of the connection portion 310 of the second ladder-shaped frame 300, multiple connection portions 310 in FIG. 3, multiple first metal jogs 716 and multiple second metal jogs 718 can be arranged between two adjacent first metal strips 220 (or two adjacent third metal strips 730).

Other connection methods, components, implementations, and advantages of the capacitor structure 100a in FIG. 1 are all applicable to the capacitor structure 100b in FIG. 8. To simplify the description, details are not repeated here.

Figure 9:
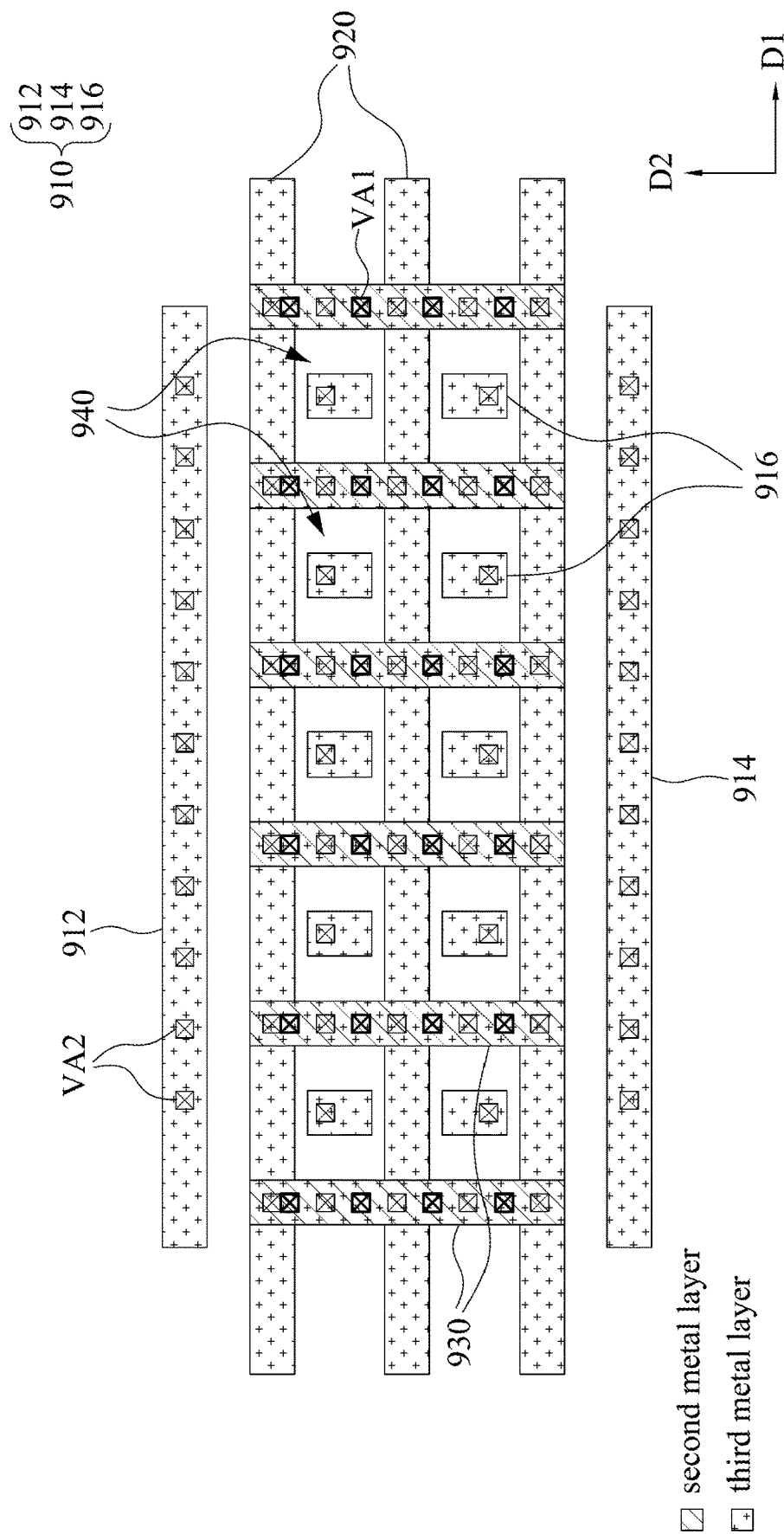
FIG. 9 is a schematic diagram of the conductive pattern in one embodiment of the first metal conductive structure, and a schematic diagram of the second metal conductive structure in one embodiment of the present disclosure.

FIG. 9 is a schematic diagram of the conductive pattern 910 in one embodiment of the first metal conductive structure, and a schematic diagram of the second metal conductive structure in one embodiment of the present disclosure. The conductive pattern 910 is implemented by the third metal layer and substantially overlapped with the second ladder-shaped frame 300. The conductive pattern 910 is electrically connected to the second metal layer of the second ladder-shaped frame 300 through the multiple second vias VA2. The conductive pattern 910 includes a first extension portion 912, a second extension portion 914 and multiple second metal strips 916. The first extension portion 912 and the second extension portion 914 are parallel to each other, and extend along the first direction D1. The multiple second metal strips 916 are arranged between the first extension portion 912 and the second extension portion 914 to form multiple columns (e.g., two columns) in the first direction D1 and multiple rows(e.g., five rows) in the second direction D2. The multiple rows of the second metal strips 416 are substantially overlapped with the multiple connection portions 310 of the second ladder-shaped frame 300, respectively.

In some embodiments, when the width of the connection portion 212 of the first ladder-shaped frame 210 is several times the width of the connection portion 310 of the second ladder-shaped frame 300, the number of rows of the second metal strips 916 can be increased corresponding to the number of the connection portions of the second ladder-shaped frame 300. On the other hand, when the length of the connection portion 310 of the second ladder-shaped frame 300 in the second direction D2 increases, the number of columns of the second metal strips 916 can increase correspondingly.

The second metal conductive structure in FIG. 9 includes multiple main portions 920 and multiple third metal strips 930. The multiple main portions 920 are implemented by the third metal layer, arranged in parallel to each other, and extend along the first direction D1. The multiple main portions 920 are arranged between the first extension portion 912 and the second extension portion 914. The multiple third metal strips 930 are implemented by the second metal layer and the third metal layer, are arranged between the first extension portion 912 and the second extension portion 914 along the first direction D1, and extend along the second direction D2. The multiple third metal strips 930 are substantially overlapped with and electrically connected to the multiple first metal strips 220, respectively. the multiple main portions 920 is electrically connected to the multiple third metal strips 930. The multiple main portions 920 cross the multiple third metal strips 930, causing the second metal conductive structure in FIG. 9 in a grid-shaped form.

Therefore, the second metal conductive structure in FIG. 9 includes the multiple opening portions 940, and each of the opening portions 940 encircles one of the second metal strips 916, but the present disclosure is not limited to this. When the number of rows and columns of the second metal strips 916 increases, each of the opening portions 940 can encircles multiple second metal strips 916. In addition, when the length of the connection portion 310 of the second ladder-shaped frame 300 increases, the number of the main portions 920 can also be increased correspondingly, so that the second metal conductive structure forms a larger grid.

Figure 10:
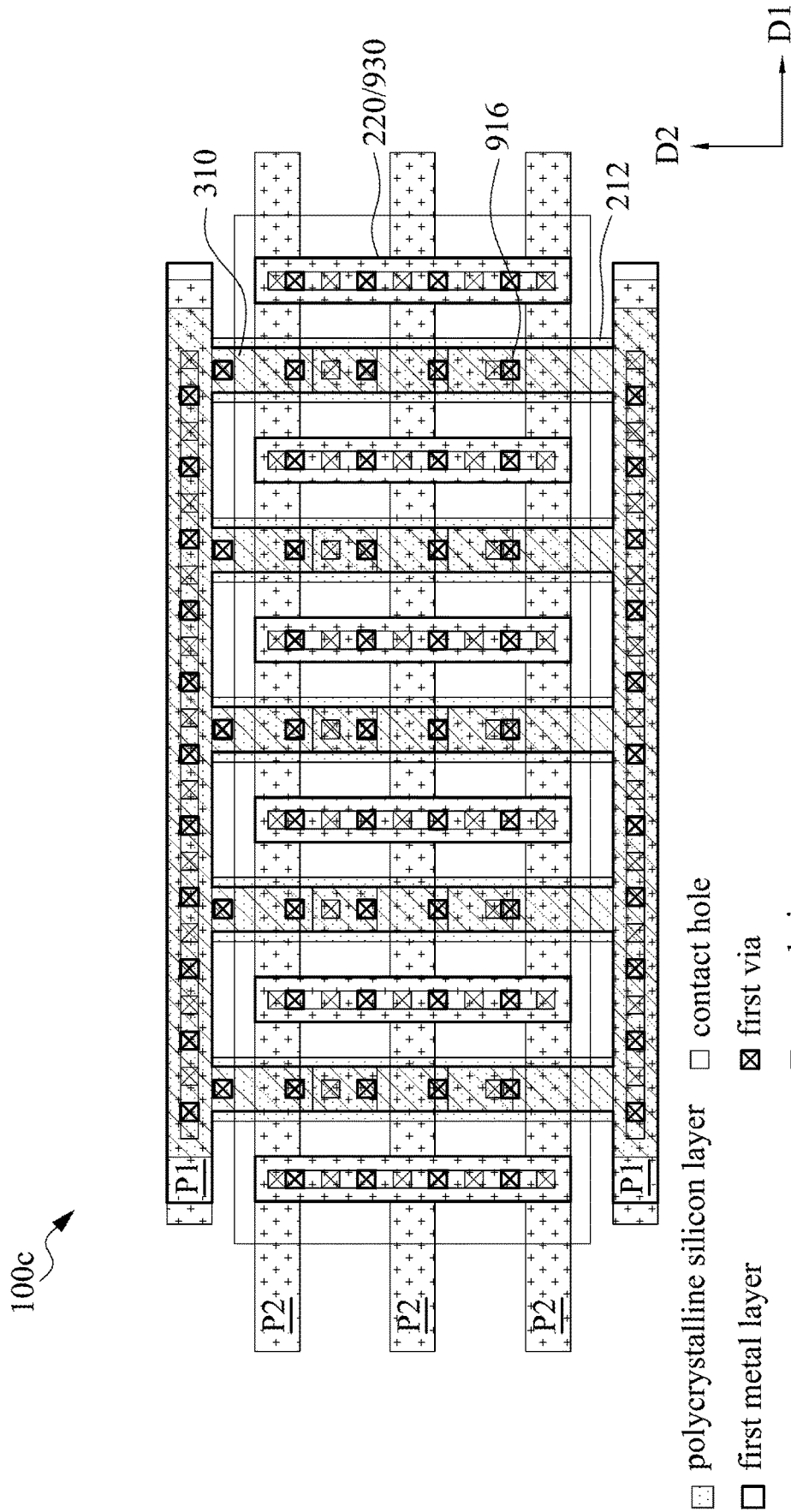
FIG. 10 is a top view of the capacitor structure in one embodiment of the present disclosure.

FIG. 10 is a top view of the capacitor structure 100c in one embodiment of the present disclosure. Specifically, the capacitor structure 100c in FIG. 10 is formed by sequentially stacking the circuit structures in FIG. 2, FIG. 3, and FIG. 9 from bottom to top. As shown in FIG. 10, one of the connection portions 310 in FIG. 3 and a row of the second metal strips 916 are arranged between two adjacent first metal strips 220 (or two adjacent third metal strips 930), but the present disclosure is not limited to this. In some embodiments, when the width of the connection portion 212 of the first ladder-shaped frame 210 is several times the width of the connection portion 310 of the second ladder-shaped frame 300, multiple connection portions 310 of FIG. 3 and multiple rows of the second metal strips 916 may be arranged between two adjacent first metal strips 220 (or two adjacent third metal strips 930).

Other connection methods, components, implementations, and advantages of the capacitor structure 100a in FIG. 1 are all applicable to the capacitor structure 100c in FIG. 10. To simplify the description, the details are not repeated here.

In the specification and claims, some terms are used to refer to specific elements. However, one skilled in art should understand that the same element may be described by different terms. The specification and claims do not use the difference names as a way to distinguish elements, but the difference in function of the elements as the basis for distinguishing. The "comprise/include" mentioned in the specification and claims is an open term, so it should be interpreted as "including but not limited to". In addition, "connect/couple" here includes any direct and indirect connection means. Therefore, if it is described that the first element is connected to the second element, It means that the first element can be directly connected to the second element through signal connection methods such as electrical connection or wireless transmission, optical transmission, or indirectly electrically or signally connected to the second element through other elements or connection means.

The description of "and/or" in specification includes any combination of one or more of the items. In addition, unless otherwise specified in the specification, any singular term includes the plural meaning at the same time.

The above are only preferred embodiments of the present disclosure, and any equivalent changes and modifications made in accordance with the claims of the present disclosure should fall within the scope of the present disclosure.

What is claimed is:

1. A capacitor structure, comprising:
a transistor structure comprising a first ladder-shaped frame implemented by a polycrystalline silicon layer and a plurality of first metal strips implemented by a first metal layer, wherein the first ladder-shaped frame is electrically isolated from the plurality of first metal strips, and encircles a part of the plurality of first metal strips, the first ladder-shaped frame is configured to form a gate of the transistor structure, and the plurality of first metal strips are configured to form a drain and a source of the transistor structure;
a first metal conductive structure at least partially overlapped and electrically connected to the first ladder-shaped frame, and comprising:
a second ladder-shaped frame implemented by the first metal layer and a second metal layer, at least partially overlapped and electrically connected to the first ladder-shaped frame; and
a conductive pattern implemented by a third metal layer, at least partially overlapped and electrically connected to the second ladder-shaped frame, and comprising:
a first extension portion extending along a first direction;
a second extension portion extending along the first direction; and
a plurality of second metal strips arranged between the first extension portion and the second extension portion along the first direction, and extending along a second direction crossing the first direction,
wherein at least one of the plurality of second metal strips is arranged between two adjacent of the plurality of first metal strips; and
a second metal conductive structure electrically connected to the plurality of first metal strips, in which the second metal conductive structure is disposed across and electrically isolated from the first ladder-shaped frame and the first metal conductive structure, and the second metal conductive structure comprises:
a plurality of third metal strips implemented by the second metal layer and the third metal layer, wherein the plurality of third metal strips is at least partially overlapped and electrically connected to the plurality of first metal strips; and
a plurality of main portions implemented by the third metal layer, arranged in parallel to each other, electrically connected to the plurality of third metal strips, and crossing the plurality of third metal strips so that the second metal conductive structure forms is in a third ladder-shaped form frame in a plane perpendicular to the first direction and the second direction,
wherein the second metal conductive structure is arranged between the first extension portion and the second extension portion, and the third ladder-shaped frame completely encircles the plurality of second metal strips in the plane perpendicular to the first direction and the second direction,
wherein in a plane view that is perpendicular to the first direction and the second direction, the plurality of second metal strips are physically isolated from each other at the third metal layer,
wherein the first ladder-shaped frame comprises a plurality of connection portions extending in a direction in which the plurality of first metal strips extend, and
wherein the second metal layer is disposed between the first metal layer and the third metal layer along a third direction perpendicular to the first direction and the second direction.

2. The capacitor structure of claim 1, wherein the transistor structure comprises a substrate, a first heavily doped region configured to form a source region of the transistor structure that connects to the source and a second heavily doped region configured to form a drain region of the transistor structure that connects to the drain, the substrate, the first heavily doped region and the second heavily doped region have identical type of dopants to form a MOS varactor comprising the transistor structure in the capacitor structure.

3. A capacitor structure, comprising:
a polycrystalline silicon layer configured to implement a first ladder-shaped frame, wherein the first ladder-shaped frame is configured to form a gate of a transistor structure;

a first metal layer configured to implement a plurality of first metal strips, wherein the plurality of first metal strips is configure to form a drain and a source of the transistor structure, the first ladder-shaped frame is electrically isolated from the plurality of first metal strips, and encircles a part of the plurality of first metal strips;

a second metal layer; and a third metal layer, wherein the first metal layer and the second metal layer are configured to implement a first metal conductive structure, the second metal layer and the third metal layer are configured to implement a second metal conductive structure, the first metal conductive structure is at least partially overlapped with and electrically connected to the first ladder-shaped frame, the second metal conductive structure is electrically connected to the plurality of first metal strips, in which the second metal conductive structure is disposed across and electrically isolated from the first ladder-shaped frame and the first metal conductive structure, wherein the first metal conductive structure comprises:

a second ladder-shaped frame implemented by the first metal layer and the second metal layer, at least partially overlapped with and electrically connected to the first ladder-shaped frame; and a conductive pattern implemented by the third metal layer, at least partially overlapped with and electrically connected to the second ladder-shaped frame, and comprising:

a first extension portion extending along a first direction;

a second extension portion extending along the first direction; and a plurality of second metal strips arranged between the first extension portion and the second extension portion in the first direction, and extending along a second direction crossing the first direction, wherein at least one of the plurality of second metal strips is arranged between adjacent two of the plurality of first metal strips, wherein the second metal conductive structure comprises:

a plurality of third metal strips implemented by the second metal layer and the third metal layer, wherein the plurality of third metal strips is at least partially overlapped with and electrically connected to the plurality of first metal strips; and a plurality of main portions implemented by the third metal layer, arranged in parallel to each other, electrically connected to the plurality of third metal strips, and crossing the plurality of third metal strips so that the second metal conductive structure forms is in a third ladder-shaped form frame in a plane perpendicular to the first direction and the second direction, wherein the second metal conductive structure is arranged between the first extension portion and the second extension portion, and the third ladder-shaped frame completely encircles the plurality of second metal strips in the plane perpendicular to the first direction and the second direction, wherein in a plane view that is perpendicular to the first direction and the second direction, the plurality of second metal strips are physically isolated from each other at the third metal layer, and wherein the second metal layer is disposed between the first metal layer and the third metal layer along a third direction perpendicular to the first direction and the second direction.

4. The capacitor structure of claim 3, wherein the transistor structure comprises a substrate, a first heavily doped region configured to form a source region of the transistor structure that connects to the source and a second heavily doped region configured to form a drain region of the transistor structure that connects to the drain, the substrate, the first heavily doped region and the second heavily doped region have identical type of dopants to form a MOS varactor comprising the transistor structure in the capacitor structure.

* * * * *